(12) United States Patent
Kim et al.

(10) Patent No.: US 11,675,232 B2
(45) Date of Patent: *Jun. 13, 2023

(54) DISPLAY APPARATUS AND LIGHT SOURCE DEVICE THEREOF

(71) Applicant: SAMSUNG ELECTRONICS CO., LTD., Suwon-si (KR)

(72) Inventors: Sungyeol Kim, Suwon-si (KR); Kyungsoo Park, Suwon-si (KR); Chunsoon Park, Suwon-si (KR); Kyehoon Lee, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 0 days.

This patent is subject to a terminal disclaimer.

(21) Appl. No.: 17/582,644

(22) Filed: Jan. 24, 2022

(65) Prior Publication Data
US 2022/0146886 A1 May 12, 2022

Related U.S. Application Data

(63) Continuation of application No. 17/340,521, filed on Jun. 7, 2021, now Pat. No. 11,262,620, which is a
(Continued)

(30) Foreign Application Priority Data

Oct. 27, 2020 (KR) .................. 10-2020-0140235
Nov. 20, 2020 (KR) .................. 10-2020-0156363

(51) Int. Cl.
*G02F 1/13357* (2006.01)
*F21K 9/64* (2016.01)
*F21Y 105/16* (2016.01)
*F21Y 115/10* (2016.01)

(52) U.S. Cl.
CPC .......... *G02F 1/133621* (2013.01); *F21K 9/64* (2016.08); *G02F 1/133602* (2013.01); *F21Y 2105/16* (2016.08); *F21Y 2115/10* (2016.08)

(58) Field of Classification Search
CPC ......... G02F 1/133621; G02F 1/133603; G02F 1/133602; F21K 9/64; F21Y 2105/16;
(Continued)

(56) References Cited

U.S. PATENT DOCUMENTS 6,861,281 B2    3/2005  Uemura et al.
6,940,099 B2    9/2005  Hata et al.
(Continued)

FOREIGN PATENT DOCUMENTS

JP    2013-4815 A     1/2013
JP    2013-114772 A   6/2013
(Continued)

OTHER PUBLICATIONS

International Search Report dated Jul. 23, 2021 issued by the International Searching Authority in counterpart International Application No. PCT/KR2021/002883 (PCT/ISA/210).

*Primary Examiner* — Anne M Hines
*Assistant Examiner* — Jose M Diaz
(74) *Attorney, Agent, or Firm* — Sughrue Mion, PLLC

(57) ABSTRACT

Disclosed is a display apparatus and light source device which includes an optical dome having a specifically defined shape to be able to maintain an optical profile of a light source. A display apparatus includes a printed circuit board (PCB); a light emitting diode (LED) chip mounted on the PCB and configured to emit light; an optical dome disposed over and enclosing the LED chip; a liquid crystal panel configured to block or pass light output from the LED chip; and an optical film arranged between the LED chip and the liquid crystal panel, wherein a ratio of a height of the optical
(Continued)

dome to a diameter of a bottom surface of the optical dome is 0.25 to 0.31.

13 Claims, 11 Drawing Sheets

Related U.S. Application Data continuation of application No. PCT/KR2021/002883, filed on Mar. 9, 2021.

(58) Field of Classification Search
CPC .. F21Y 2115/10; H01L 25/0753; H01L 33/10; H01L 33/20; H01L 33/405; H01L 33/502; H01L 33/60; H01L 33/58; H01L 33/483; H01L 33/50; H01L 33/56
See application file for complete search history.

(56) References Cited

U.S. PATENT DOCUMENTS

| | | | |
|---|---|---|---|
| 8,845,143 B2 | 9/2014 | Hsu et al. | |
| 9,876,149 B2 | 1/2018 | Bang et al. | |
| 10,378,725 B2 | 8/2019 | Lee et al. | |
| 10,763,408 B2 | 9/2020 | Yamada | |
| 10,809,596 B2 | 10/2020 | Choi et al. | |
| 11,262,620 B1 * | 3/2022 | Kim | G02F 1/133603 |
| 11,476,396 B2 | 10/2022 | Yamamoto et al. | |
| 2014/0104850 A1 | 4/2014 | Yamamoto et al. | |
| 2014/0327024 A1 | 11/2014 | Ishihara et al. | |
| 2015/0255687 A1 | 9/2015 | Tong et al. | |
| 2019/0305197 A1 | 10/2019 | Yamada | |

FOREIGN PATENT DOCUMENTS

| | | |
|---|---|---|
| JP | 6974069 B2 | 12/2021 |
| KR | 2003-0001553 A | 1/2003 |
| KR | 10-2008-0062435 A | 7/2008 |
| KR | 10-2009-0072941 A | 7/2009 |
| KR | 10-1646262 B1 | 8/2016 |
| KR | 10-2016-0141302 A | 12/2016 |
| KR | 10-2019-0010478 A | 1/2019 |
| KR | 10-2001665 B1 | 7/2019 |
| KR | 10-2110477 B1 | 5/2020 |
| KR | 10-2427049 B1 | 7/2022 |

* cited by examiner

[FIG. 1]
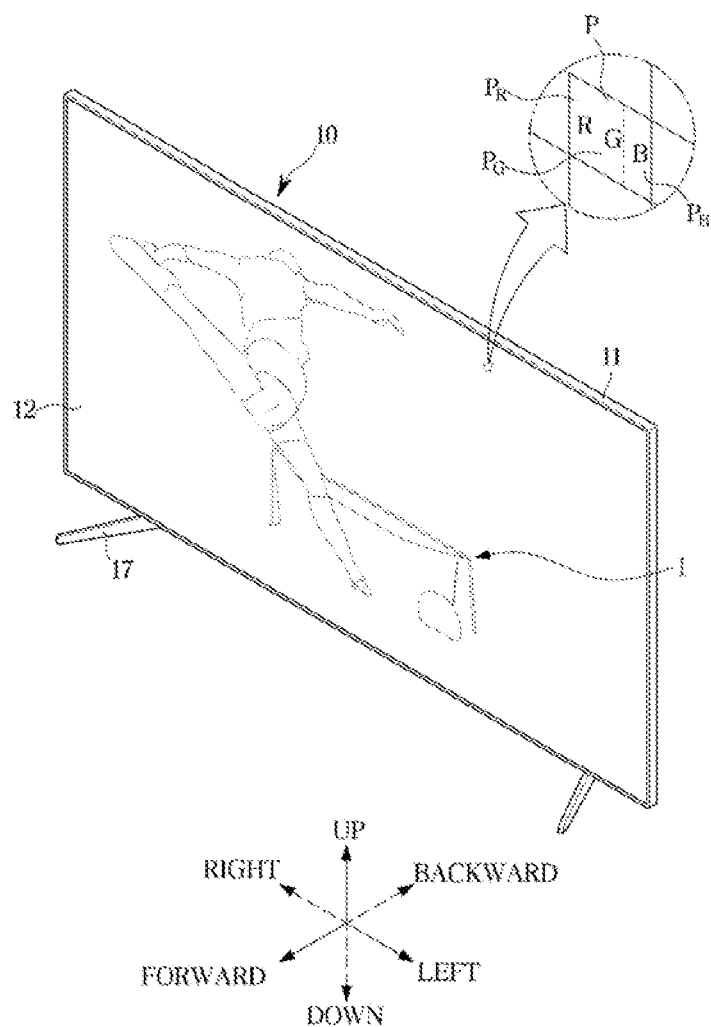

[FIG. 2]
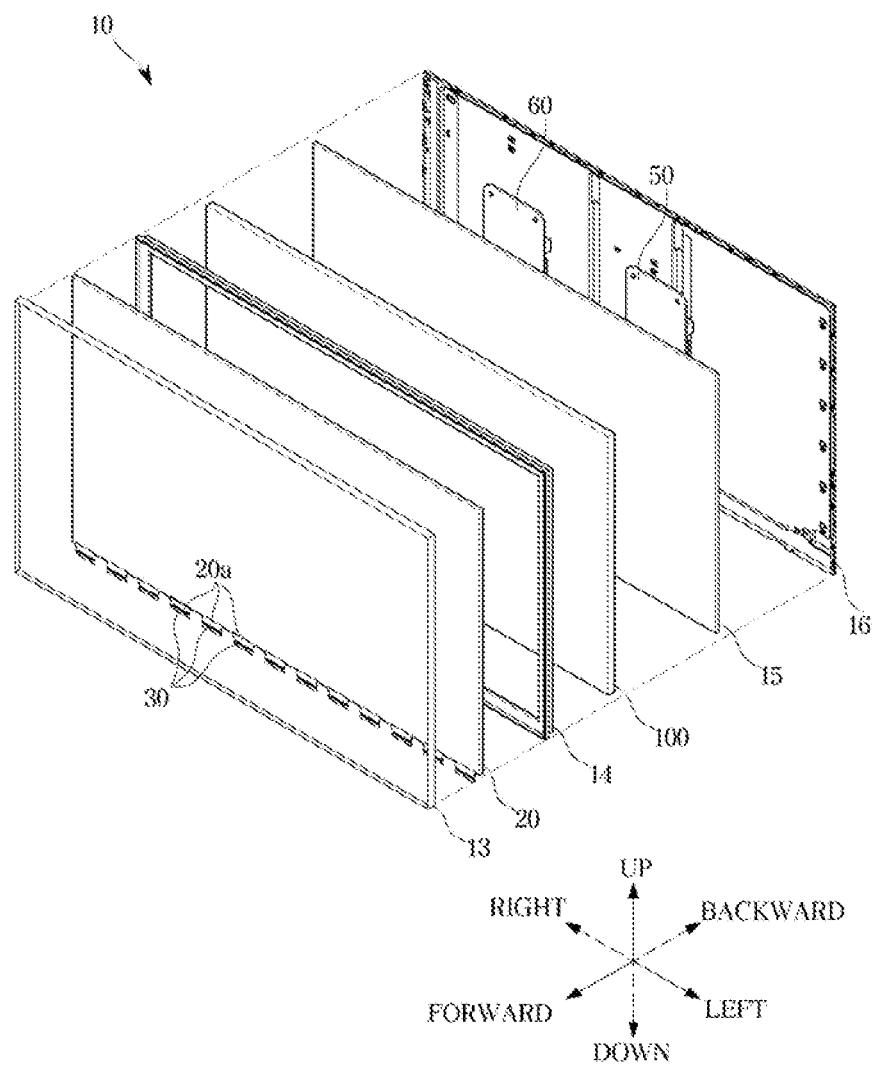

[FIG. 3]
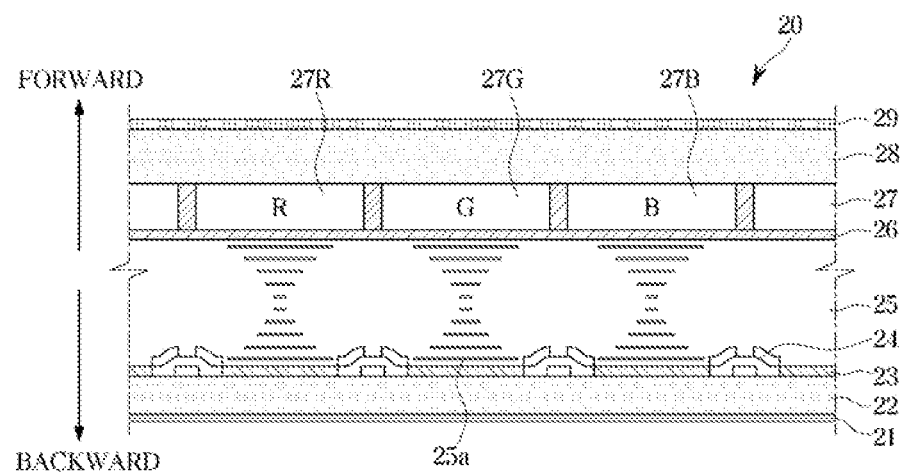

[FIG. 4]
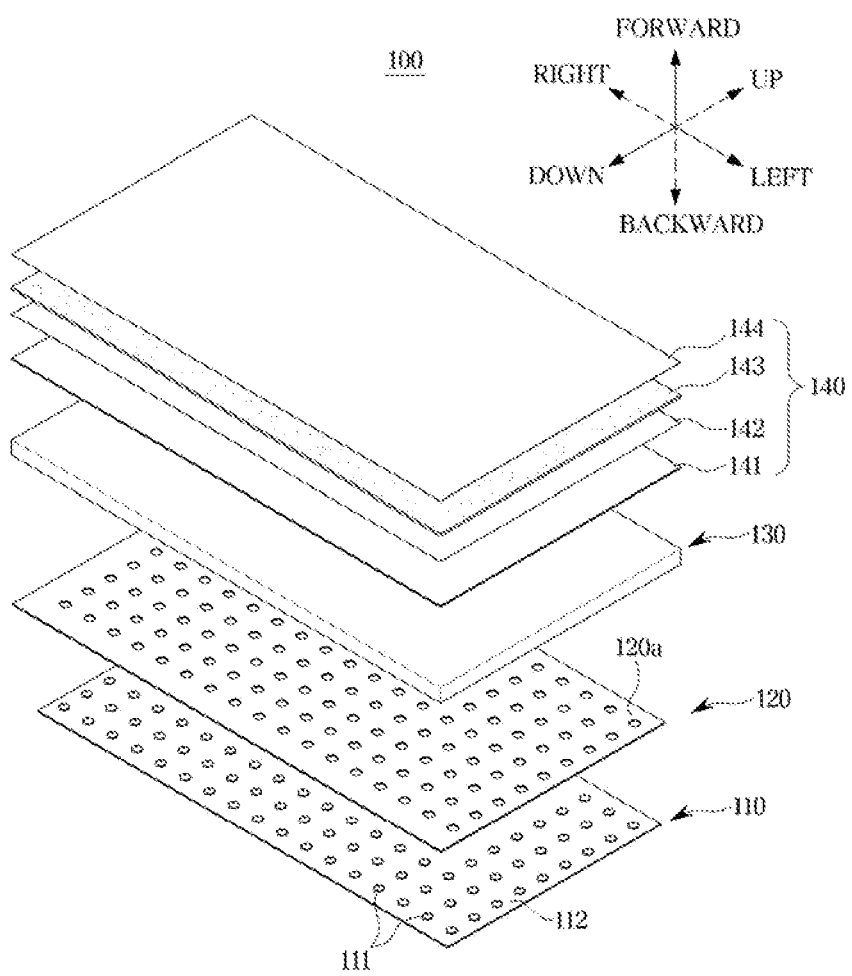

[FIG. 5]
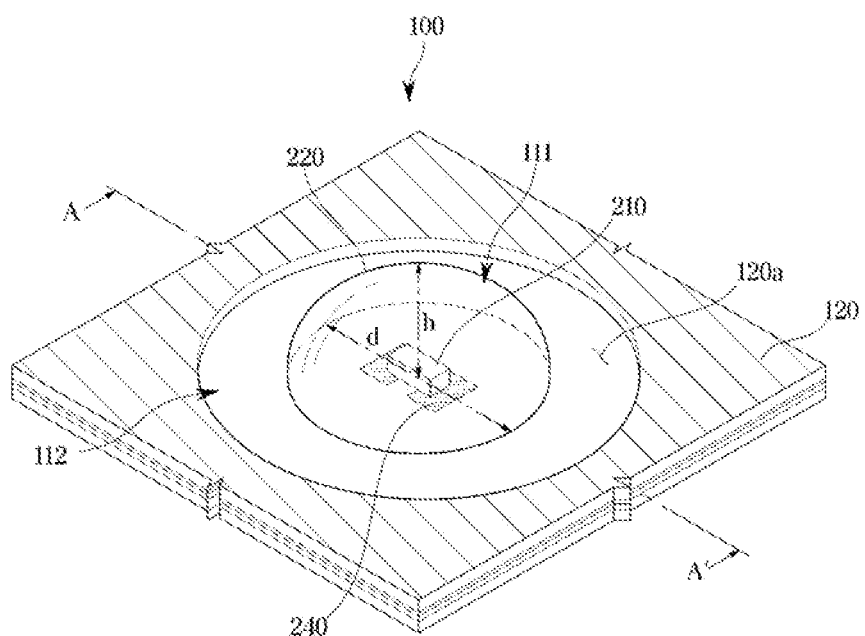

【FIG. 6】
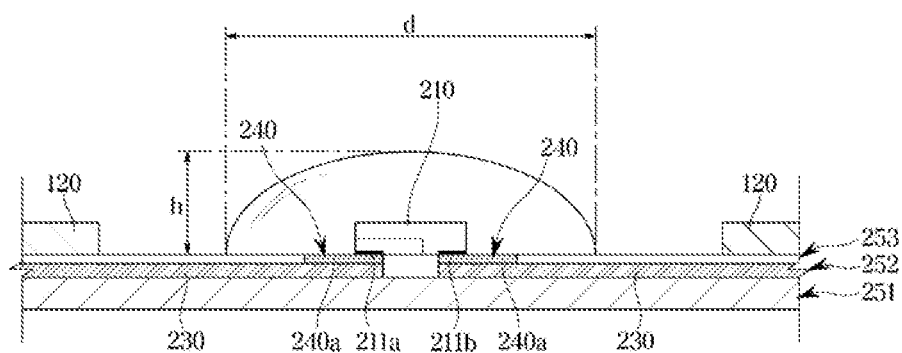

[FIG. 7]
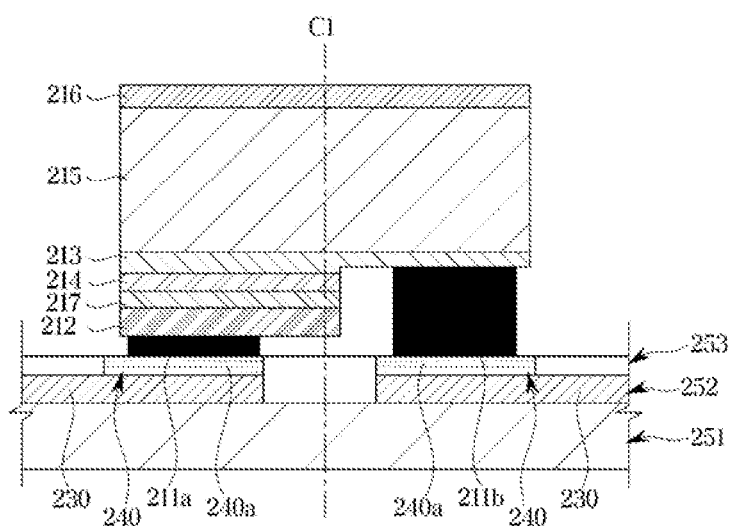

【FIG. 8】
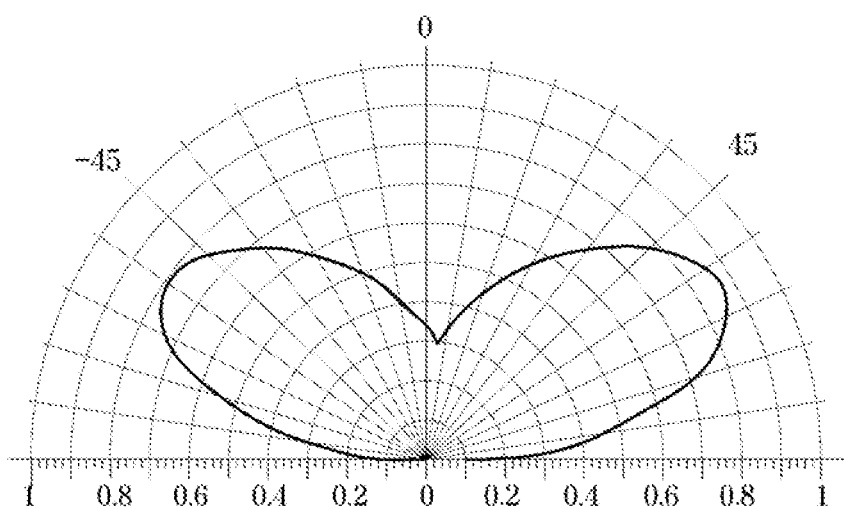

【FIG. 9】
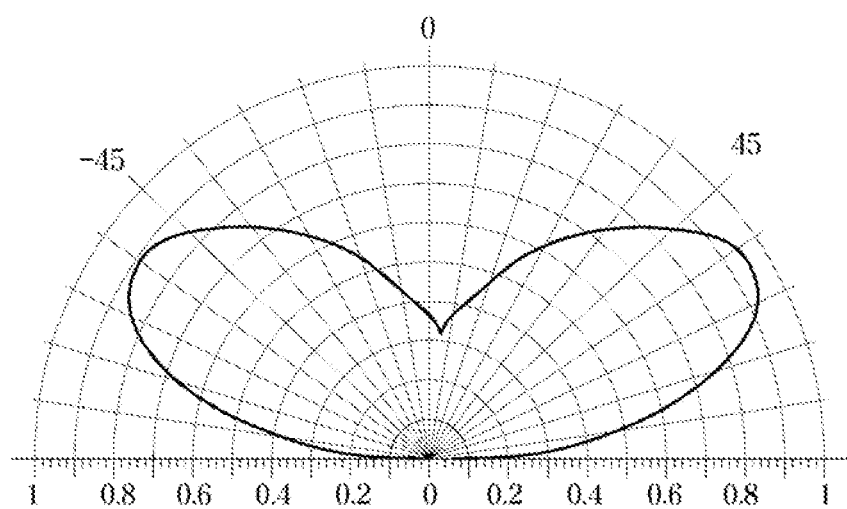

[FIG. 10]
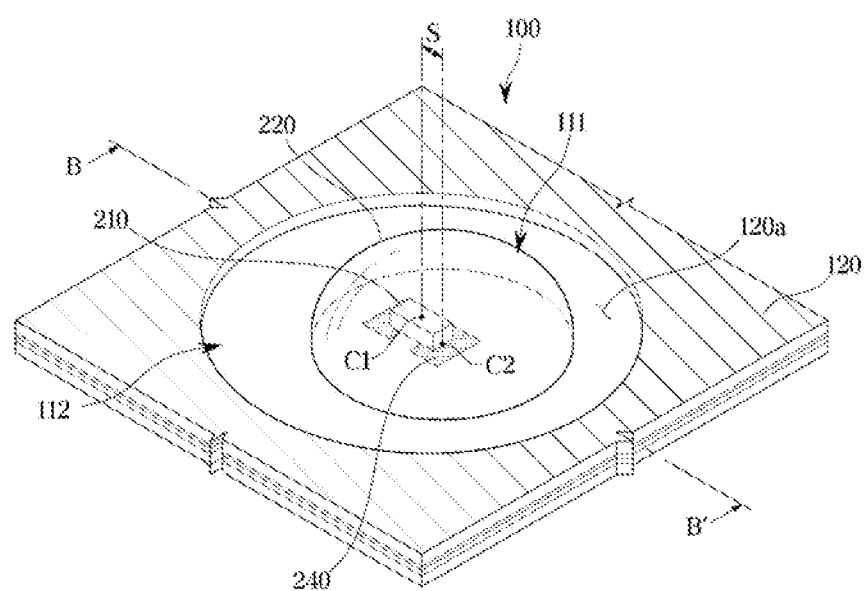

[FIG. 11]
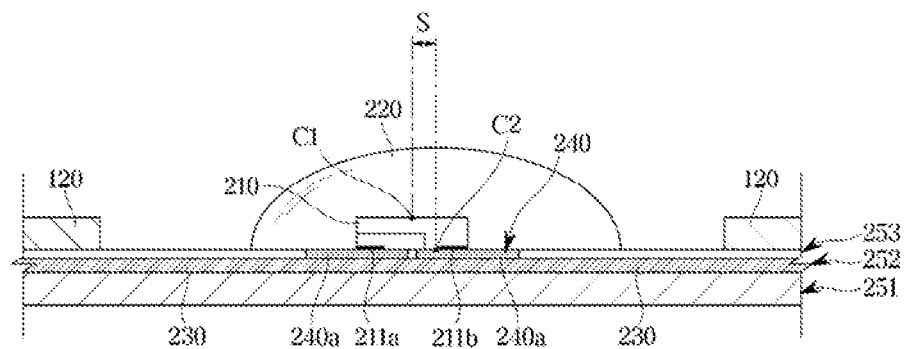

DISPLAY APPARATUS AND LIGHT SOURCE DEVICE THEREOF

CROSS-REFERENCE TO RELATED APPLICATIONS

This application is continuation of U.S. application Ser. No. 17/340,521, filed on Jun. 7, 2021, which is a bypass continuation application of International Application No. PCT/KR2021/002883 filed on Mar. 9, 2021, which claims priority from Korean Patent Application No. 10-2020-0140235, filed on Oct. 27, 2020, and Korean Patent Application No. 10-2020-0156363, filed on Nov. 20, 2020, in the Korean Intellectual Property Office, the disclosures of which are incorporated herein by reference in their entireties.

BACKGROUND

1. Field

The disclosure relates to a display apparatus and light source device thereof, and more particularly, to a display apparatus and light source device thereof capable of maintaining an optical profile of a light source even with an optical dome included.

2. Description of Related Art

In general, display apparatuses are a type of output devices for displaying obtained or stored electrical information for the user by converting the electrical information to visual information, and are used in various fields such as homes or workplaces.

There are many different display apparatuses such as monitor devices connected to personal computers (PCs) or server computers, portable computer systems, Global Positioning System (GPS) terminals, general television sets, Internet protocol televisions (IPTVs), portable terminals (e.g., smart phones, tablet PCs, personal digital assistants (PDAs), and cellular phones), other display devices for reproducing images like advertisements or films, and other various kinds of audio/video systems.

Generally, display apparatuses include a light source device to convert electrical information to visual information where the light source device includes a plurality of light sources to separately emit light.

For example, each of the plurality of light sources may include a light emitting diode (LED) or an organic LED (OLED) that may be mounted on a circuit board or a substrate.

Further, the light source device may include a lens provided to cover a light source to widen an optical diffusion area of light emitted from the light source. However, the number of blocks for local dimming is limited due to expansion of the optical diffusion area through the lens, which constrains enhancement of contrast ratios.

Recent display apparatuses sometimes have a light source device without lenses because of these constraints. Such a light source device includes a light-transmitting resin layer in order to protect the light source. However, because of the light-transmitting resin layer, an optical profile of the light source may be changed.

SUMMARY

An aspect of the disclosure provides a display apparatus and light source device which includes a light source having a bat-wing shaped optical profile and an optical dome capable of maintaining the bat-wing shaped optical profile.

Another aspect of the disclosure provides a display apparatus and light source device which includes an optical dome having a specifically defined shape to be able to maintain an optical profile of a light source.

Another aspect of the disclosure provides a display apparatus and light source device capable of reducing an optical distance while maintaining the number of light sources by defining a specific shape of an optical dome.

Another aspect of the disclosure provides a display apparatus and light source device capable of reducing the number of light sources while maintaining an optical distance by defining a specific shape of an optical dome.

According to embodiments, a display apparatus is provided. The display apparatus includes: a printed circuit board (PCB); a light emitting diode (LED) chip mounted on the PCB and configured to emit light; an optical dome disposed over and enclosing the LED chip; a liquid crystal panel configured to block or pass light output from the LED chip; and an optical film arranged between the LED chip and the liquid crystal panel, wherein a ratio of a height of the optical dome to a diameter of a bottom surface of the optical dome is 0.25 to 0.31.

According to one or more embodiments, the LED chip is provided to emit blue light.

According to one or more embodiments, the optical film includes a quantum dot sheet formed to enhance color reproducibility by making a change in wavelength of light.

According to one or more embodiments, the LED chip is mounted on a mounting surface of the PCB in a chip on board (COB) method.

According to one or more embodiments, the LED chip includes a horizontal side and a vertical side, and wherein the vertical side is 500 μm or less in length and the horizontal side is 500 μm or less in length.

According to one or more embodiments, a ratio of a distance between a center of the bottom surface of the optical dome and a center of the LED chip to the diameter of the bottom surface of the optical dome is greater than 0 but less than or equal to 0.2.

According to one or more embodiments, the LED chip includes an n-type semiconductor layer, a p-type semiconductor layer, and a light-emitting layer arranged between the n-type semiconductor layer and the p-type semiconductor layer configured to emit light.

According to one or more embodiments, the LED chip further includes: a growth substrate arranged to cover an upper surface of the n-type semiconductor layer or the p-type semiconductor layer, a distributed Bragg reflector (DBR) layer arranged on an upper surface of the growth substrate, and a metal reflector layer arranged on a lower surface of the light-emitting layer.

According to one or more embodiments, the metal reflector layer includes aluminum (Al) or a DBR.

According to one or more embodiments, the growth substrate includes a sapphire substrate.

According to one or more embodiments, the display apparatus further includes a reflecting sheet attached to the PCB, the reflecting sheet including a through hole provided for the optical dome to protrude through.

According to one or more embodiments, the optical dome includes silicon or epoxy resin.

According to one or more embodiments, the ratio of the height of the optical dome to the diameter of the bottom surface of the optical dome is 0.28.

According to one or more embodiments, the optical film includes a diffuser plate configured to diffuse light emitted from the LED chip.

According embodiments, a display apparatus is provided. The display apparatus includes: a printed circuit board (PCB); a light emitting diode (LED) chip mounted on the PCB and configured to emit light; an optical dome disposed over and enclosing the LED chip; a liquid crystal panel configured to block or pass light output from the LED chip; and an optical film arranged between the LED chip and the liquid crystal panel, wherein the optical dome allows light emitted from the LED chip to pass without degrading a bat-wing optical profile of the light emitted by the LED chip.

According to one or more embodiments, a ratio of a height of the optical dome to a diameter of a bottom surface of the optical dome is 0.25 to 0.31.

According to one or more embodiments, a ratio of a distance between a center of a bottom surface of the optical dome and a center of the LED chip to a diameter of the bottom surface of the optical dome is greater than 0 but less than or equal to 0.2.

According to embodiments, a display apparatus is provided. The display apparatus includes: a printed circuit board (PCB); a light emitting diode (LED) chip mounted on the PCB configured to emit light; an optical dome disposed over and enclosing the LED chip; a liquid crystal panel configured to block or pass light output from the LED chip; and an optical film arranged between the LED chip and the liquid crystal panel, wherein a center of the LED chip is offset from a center point of a bottom surface of the optical dome.

According to one or more embodiments, a ratio of a height of the optical dome to a diameter of the bottom surface of the optical dome is 0.25 to 0.31.

According to one or more embodiments, a ratio of a distance between a center of the bottom surface of the optical dome and a center of the LED chip to a diameter of the bottom surface of the optical dome is greater than 0 but less than or equal to 0.2.

According to an aspect of the disclosure, a display apparatus and light source device includes an optical dome having a specifically defined shape to be able to maintain an optical profile of a light source.

According to an aspect of the disclosure, a display apparatus including light source device is capable of maximizing the number of light sources by reducing the optical distance by defining a specific shape of an optical dome.

According to an aspect of the disclosure, a display apparatus including light source device is capable of reducing the number of light sources while maintaining the optical distance by defining a specific shape of an optical dome.

BRIEF DESCRIPTION OF DRAWINGS

FIG. 1 is a perspective view of a display apparatus, according to an exemplary embodiment of the disclosure.

FIG. 2 is an exploded perspective view of a display apparatus, according to an exemplary embodiment of the disclosure.

FIG. 3 is a side cross-sectional view of a liquid crystal panel of a display apparatus, according to an exemplary embodiment of the disclosure.

FIG. 4 is an exploded perspective view of a light source device, according to an exemplary embodiment of the disclosure.

FIG. 5 is an enlarged perspective view of a portion of a light source device, according to an exemplary embodiment of the disclosure.

FIG. 6 is a cross-sectional view along line A-A of FIG. 5 according to an exemplary embodiment of the disclosure.

FIG. 7 is an enlarged view of a light emitting diode (LED) chip shown in FIG. 6 according to an exemplary embodiment of the disclosure.

FIG. 8 illustrates an optical profile of an LED chip, according to an exemplary embodiment of the disclosure.

FIG. 9 illustrates an optical profile in a case that an optical dome covers an LED chip, according to an exemplary embodiment of the disclosure.

FIG. 10 illustrates an optical dome separated from the center of an LED chip, according to an exemplary embodiment of the disclosure.

FIG. 11 is a cross-sectional view along line B-B of FIG. 10 according to an exemplary embodiment of the disclosure.

DETAILED DESCRIPTION

The exemplary embodiments described in the disclosure are only the most preferred examples and are provided to assist in a comprehensive understanding of the disclosure as defined by the claims and their equivalents. Accordingly, those of ordinary skilled in the art will recognize that various changes and modifications of the embodiments described herein can be made without departing from the scope and spirit of the disclosure.

As used herein, the singular forms "a", "an" and "the" include the plural forms as well, unless the context clearly indicates otherwise. For the sake of clarity, the elements of the drawings are drawn with exaggerated forms and sizes.

It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section.

It is to be understood that the singular forms "a," "an," and "the" include plural references unless the context clearly dictates otherwise.

According to an exemplary embodiment of the disclosure, an optical film may include a diffuser plate 130 and an optical sheet 140.

FIG. 1 is a perspective view of a display apparatus, according to an exemplary embodiment of the disclosure. FIG. 2 is an exploded perspective view of a display apparatus, according to an exemplary embodiment of the disclosure. FIG. 3 is a side cross-sectional view of a liquid crystal panel of a display apparatus, according to an exemplary embodiment of the disclosure. FIG. 4 is an exploded perspective view of a light source device, according to an exemplary embodiment of the disclosure.

A display apparatus 10 is a device that is able to process image signals received from the outside and visually present the processed image. In the following description, it is assumed that the display apparatus 10 is a television (TV), but embodiments of the disclosure are not limited thereto.

For example, the display apparatus 10 may be implemented in various forms, such as a monitor, a portable multimedia device, a portable communication device, and any device capable of visually presenting images, without being limited thereto.

The display apparatus 10 may be a large format display (LFD) installed outdoors such as on a rooftop of a building or at a bus stop. The display apparatus 10 is not, however, exclusively installed outdoors, but may be installed at any place, even indoors with a lot of foot traffic, e.g., at subway stations, shopping malls, theaters, offices, stores, etc.

The display apparatus 10 may receive content data including video data and audio data from various content sources, and output video and audio corresponding to the video data and the audio data. For example, the display apparatus 10 may receive content data through a broadcast receiving antenna or a cable, receive content data from a content reproducing device, or receive content data from a content provider's content server.

As shown in FIG. 1, the display apparatus 10 may include a main body 11, a screen 12 for displaying an image I, and a supporter 17 arranged under the main body 11 for supporting the main body 11.

The main body 11 forms the exterior of the display apparatus 10. Additionally, components for the display apparatus 10 to display the image I or perform many different functions may be included in the main body 11. Although the main body 11 of FIG. 1 is shaped like a flat plate, it is not limited thereto. For example, the main body 11 may have the form of a curved plate.

The screen 12 may be formed on the front of the main body 11 for displaying the image I. For example, the screen 12 may display still images or moving images. For example, the screen 12 may display two dimensional (2D) plane images, or three dimensional (3D) stereographic images using parallax of both eyes of the user.

A plurality of pixels P are formed on the screen 12, and the image I displayed on the screen 12 may be formed by the light emitted by each of the plurality of pixels P. For example, the light emitted by the plurality of pixels P may be combined like a mosaic into the image I on the screen 12.

Each of the plurality of screens 12 may emit light in various colors and brightnesses. For example, each of the plurality of pixels P may include a self-luminous panel (e.g., a light emitting diode (LED) panel) capable of directly emitting light or a non-luminous panel (e.g., a liquid crystal panel) capable of passing or blocking light emitted from a light source device.

Each of the plurality of pixels P may include subpixels $P_R$, $P_G$, and $P_b$ to emit different colors of light.

The subpixels $P_R$, $P_G$, and $P_B$ may include a red subpixel $P_R$ for emitting red light, a green subpixel $P_G$ for emitting green light, and blue subpixel $P_B$ for emitting blue light. For example, the red light may have wavelengths of about 620 nanometers ((nm, a billionth of a meter) to about 750 nm; the green light may have wavelengths of about 495 nm to about 570 nm; and the blue light may have wavelengths of about 450 nm to about 495 nm.

FIG. 8 illustrates an optical profile of an LED chip, according to an exemplary embodiment of the disclosure.

FIG. 9 illustrates an optical profile in a case that an optical dome covers an LED chip, according to an exemplary embodiment of the disclosure.

FIG. 10 illustrates an optical dome separated from the center of an LED chip, according to an exemplary embodiment of the disclosure.

FIG. 11 is a cross-sectional view along line B-B of FIG. 10.

By combinations of the green light of the green subpixel $P_G$, and the blue light of the blue subpixel $P_B$, each of the plurality of pixels P may emit various brightnesses and colors of light.

As shown in FIG. 2, the main body 11 may contain many different kinds of components to create the image I on the screen 12.

For example, the main body 11 may include a light source device 100, which is a surface light source, a liquid crystal panel 20 for blocking or passing the light emitted from the light source device 100, a control assembly 50 for controlling operations of the light source device 100 and the liquid crystal panel 20, and a power assembly 60 for supplying power to the light source device 100 and the liquid crystal panel 20. Furthermore, the main body 11 includes a bezel 13, a frame middle mold 14, a bottom chassis 15, and a rear cover 16 to support and secure the liquid crystal panel 20, the light source device 100, the control assembly 50, and the power assembly 60.

The light source device 100 may include a point light source for emitting monochromatic light or white light, and may refract, reflect, and scatter the light emitted from the point light source to convert the light to uniform surface light. For example, the light source device 100 may include a plurality of light sources for emitting monochromatic light or white light, a diffuser plate for diffusing incident light from the plurality of light sources, a reflecting sheet for reflecting light emitted from the plurality of light sources and the rear surface of the diffuser plate, and an optical sheet for refracting and scattering light emitted from the front surface of the diffuser plate.

In this way, the light source device 100 may emit the uniform surface light in a forward direction by refracting, reflecting and scattering the light emitted from the light source.

A structure of the light source device 100 will now be described in more detail.

The liquid crystal panel 20 is arranged in front of the light source device 100 for blocking or passing the light emitted from the light source device 100 to produce the image I.

The front surface of the liquid crystal panel 20 may form the screen 12 of the aforementioned display apparatus 10. The liquid crystal panel 20 may include the plurality of pixels P. The plurality of pixels P included in the liquid crystal panel 20 may separately block or pass the light from the light source device 100, and the light having passed the plurality of pixels P forms the image I to be displayed on the screen 12.

For example, as shown in FIG. 3, the liquid crystal panel 20 may include a first polarizer film 21, a first transparent substrate 22, a pixel electrode 23, a thin film transistor (TFT) 24, a liquid crystal layer 25, a common electrode 26, a color filter 27, a second transparent substrate 28, and a second polarizer film 29.

The first transparent substrate 22 and the second transparent substrate 28 may securely support the pixel electrode 23, the TFT 24, the liquid crystal layer 25, the common electrode 26, and the color filter 27. The first and second transparent substrates 22 and 28 may be formed of tempered glass or transparent resin.

On the outer surfaces of the first and second transparent substrates 22 and 28, the first and second polarizer films 21 and 29 are applied, respectively.

The first and second polarizer films 21 and 29 may each pass particular light while blocking the other light. For example, the first polarizer film 21 passes light having a magnetic field oscillating in a first direction while blocking other light. The second polarizer film 29 passes light having a magnetic field oscillating in a second direction while blocking other light. The first and second directions may be perpendicular to each other. Accordingly, a polarization direction of light passed by the first polarizer film 21 and an oscillation direction of light passed by the second polarizer film 29 are perpendicular to each other. As a result, the light in general may not pass both the first and second polarizer films 21 and 29 at the same time.

The color filter 27 may be arranged on the inner side of the second transparent substrate 28.

The color filter 27 may include, for example, a red color filter 27R for passing red light, a green color filter 27G for passing green light, and a blue color filter 27B for passing blue light. The red, green, blue color filters 27R, 27G, and 27B may be arranged side by side. An area in which the color filter 27 is formed corresponds to the pixel P as described above. An area where the red color filter 27R is formed corresponds to the red subpixel $P_R$; an area where the green color filter 27G is formed corresponds to the green subpixel $P_G$; and an area where the blue color filter 27B is formed corresponds to the blue subpixel $P_B$.

The pixel electrode 23 may be provided on the inner side of the first transparent substrate 22, and the common electrode 26 may be provided inside from the second transparent substrate 28.

The pixel electrode 23 and the common electrode 26 are formed of a conductive metal material and may produce an electric field to change an arrangement of liquid crystal molecules 115a that form the liquid crystal layer 25.

The pixel electrode 23 and the common electrode 26 may be formed of a transparent material to pass the incident light from the outside. For example, the pixel electrode 23 and the common electrode 26 may be formed of indium tin oxide (ITO), indium zinc oxide (IZO), silver (Ag) nano wire, carbon nano tube (CNT), graphene, or 3,4-ethylenedioxythiophene (PEDOT).

The TFTs 24 are arranged inside the second transparent substrate 28.

The TFT 24 may pass or block the current flowing in the pixel electrode 23. For example, depending on whether the TFT 24 is turned on (closed) or turned off (opened), an electric field may be formed or removed from between the pixel electrode 23 and the common electrode 26.

The TFT 24 may be formed of poly-silicon and may be formed using a semiconductor process such as lithography, deposition, or ion implantation process.

The liquid crystal layer 25 is formed between the pixel electrode 23 and the common electrode 26 and may be filled with the liquid crystal molecules 25a.

The liquid crystals are in an intermediate state between solid (crystal) and fluid. Most liquid crystal materials are organic compounds where the molecules are shaped like thin, long rods. The arrangement of the molecules are irregular in one direction and regular in another direction. As a result, the liquid crystal has both fluidity of a liquid and optical anisotropy of a crystal (solid).

Furthermore, the liquid crystal reveals an optical property according to a change in electric field. For example, the liquid crystal may have varying directions of arrangement of molecules that form the liquid crystal according to a change in electric field. When an electric field is produced in the liquid crystal layer 25, the liquid crystal molecules 25a of the liquid crystal layer 25 are arranged along the direction of the electric field, and otherwise when no electric field is produced in the liquid crystal layer 25, the liquid crystal molecules 25a may be arranged irregularly or arranged along the alignment layer (not shown). Consequently, the optical property of the liquid crystal layer 25 may be changed according to whether there is an electric field passing through the liquid crystal layer 25.

A cable 20a is provided on one side of the liquid crystal panel 20 for transmitting image data to the liquid crystal panel 20 and a display driver integrated circuit (DDI) 30 (hereinafter, called a 'driver IC') for processing digital image data to output an analog image signal.

The cable 20a may electrically connect between the control assembly 50 and/or the power assembly 60 and the driver IC 30 and further between the driver IC 30 and the liquid crystal panel 20. The cable 20a may include e.g., a bendable flexible flat cable or a film cable.

The driver IC 30 may receive image data and power from the control assembly 50 and/or power assembly 60 through the cable 20a and transmit image data and driving current to the liquid crystal panel 20 through the cable 20a.

Furthermore, the cable 20a and the driver IC 30 may be integrally implemented as a film cable, a chip on film (COF), a table carrier package (TCP), etc. In other words, the driver IC 30 may be arranged on the cable 110b. It is not, however, limited thereto, and the driver IC 30 may also be arranged on the liquid crystal panel 20.

The control assembly 50 may include a control circuit for controlling operations of the liquid crystal panel 20 and the light source device 100. The control circuit may process image data received from an external content source, transmit image data to the liquid crystal panel 20, and transmit dimming data to the light source device 100.

The power assembly 60 may supply power to the liquid crystal panel 20 and the light source device 100 so as for the light source device 100 to output surface light and for the liquid crystal panel 20 to block or pass the light from the light source device 100.

The control assembly 50 and the power assembly 60 may be implemented with printed circuit boards (PCBs) and various circuits mounted on the PCBs. For example, a power circuit may include a power circuit board, and a capacitor, a coil, a resistor, a processor, etc., which are mounted on the power circuit board. Furthermore, the control circuit may include a control circuit board with a memory and a processor mounted thereon.

The light source device 100 will now be described.

FIG. 4 is an exploded view of a light source device, according to an exemplary embodiment.

The light source device 100 includes a light source module 110 for generating light, a reflecting sheet 120 for reflecting light, a diffuser plate 130 for uniformly diffusing light, and an optical sheet 140 for enhancing brightness of output light.

The light source module 110 may include a plurality of light sources 111 for emitting light and a substrate 112 for supporting/fixing the plurality of light sources 111.

The plurality of light sources 111 may be arranged in a predefined pattern to emit light with uniform brightness. The plurality of light sources 111 may be arranged such that a light source is equidistant from its neighboring light sources.

For example, as shown in FIG. 4, the plurality of light sources 111 may be arranged in rows and columns. Accordingly, the plurality of light sources may be arranged such that neighboring four light sources form almost a rectangle. Furthermore, a light source is located to be adjacent to four other light sources, and the distances between the light source and the four neighboring light sources are almost the same.

In another example, the plurality of light sources may be arranged in multiple rows, and a light source belonging to a row may be placed in the middle of two light sources belonging to two neighboring rows. Accordingly, the plurality of light sources may be arranged such that neighboring three light sources form almost a triangle. In this case, a light source is located to be adjacent to six other light sources, and the distances between the light source and the six neighboring light sources are almost the same.

The arrangement of the plurality of light sources 111 is not, however, limited to the aforementioned patterns, and the plurality of light sources 111 may be arranged in various patterns to emit light with uniform brightness.

The light sources 111 may employ devices capable of emitting monochromatic light (light having a particular wavelength, e.g., blue light) or white light (mixed light of red light, green light, and blue light) in various directions when powered. For example, the light sources 111 may include light emitting diodes (LEDs).

The substrate 112 may fix the plurality of light sources 111 to prevent the light sources 111 from being moved. In addition, the substrate 112 may supply power to each of the light sources 111 so that the light source 111 may emit light.

The substrate 112 may fix the plurality of light sources 111, and may be formed of a synthetic resin or tapered glass. Alternatively, the substrate 112 may be a PCB with conductive power supply lines formed therein to supply power to the light sources 111.

The reflecting sheet 120 may reflect light emitted from the plurality of light sources 111 to a forward direction or to an approximately forward direction.

A plurality of through holes 120a are formed in the reflecting sheet 120 at positions corresponding to the plurality of light sources 111 of the light source module 110. Furthermore, the light sources 111 of the light source module 110 may pass the through holes 120a and protrude forward from the reflecting sheet 120.

For example, the plurality of light sources 111 of the light source module 110 are inserted to the plurality of through holes 120a formed at the reflecting sheet 120 during an assembly process of the reflecting sheet 120 and the light source module 110. Hence, the plurality of light sources 111 of the light source module 110 may be located on the front of the reflecting sheet 120 while the substrate 112 of the light source module 110 are located behind the reflecting sheet 120.

Accordingly, the plurality of light sources 111 may emit light from the front of the reflecting sheet 120.

The plurality of light sources 111 may emit light in various directions from the front of the reflecting sheet 120. The light may be emitted not only toward the diffuser plate 130 but also toward the reflecting sheet 120 from the light sources 111. Additionally, the reflecting sheet 120 may reflect the light emitted to the reflecting sheet 120 toward the diffuser plate 130.

The light emitted from the light sources 111 passes various objects such as the diffuser plate 130 and the optical sheet 140. When the light is passing the diffuser plate 130 and the optical sheet 140, a portion of the incident light is reflected from surfaces of the diffuser plate 130 and the optical sheet 140. The reflecting sheet 120 may reflect the light reflected by the diffuser plate 130 and the optical sheet 140.

The diffuser plate 130 may be arranged in front of the light source module 110 and the reflecting sheet 120 to uniformly diffuse the light emitted from the light sources 111 of the light source module 110.

As described above, the plurality of light sources 111 are located everywhere on the rear surface of the light source device 100. The plurality of light sources 111 are equidistantly arranged on the rear surface of the light source device 100, but there may be differences in brightness depending on the positions of the plurality of light sources 111.

To eliminate the difference in brightness due to the plurality of light sources 111, the diffuser plate 130 may diffuse the light emitted from the plurality of light sources 111 within the diffuser plate 130. In other words, the diffuser plate 130 may uniformly emit non-uniform light forward from the plurality of light sources 111.

An optical sheet 140 may include various sheets to improve brightness and uniformity of the brightness. For example, the optical sheet 140 may include a diffuser sheet 141, a first prism sheet 142, a second prism sheet 143, a reflective polarizer sheet 144, etc.

The diffuser sheet 141 diffuses light for uniformity of brightness. Light emitted from the light sources 111 may be diffused by the diffuser plate 130 and may be further diffused by the diffuser sheet 141 included in the optical sheet 140.

The first and second prism sheets 142 and 143 may concentrate the light diffused by the diffuser sheet 141, thereby increasing brightness. The first and second prism sheets 142 and 143 may have triangular prism patterns, which are arranged next to each other to form a plurality of bands.

The reflective polarizer film 144 is a kind of polarizer film which may transmit a portion of the incident light while reflecting the other portions of the incident light to improve brightness. For example, the reflective polarizer sheet 144 may pass light polarized in the same direction as a predetermined polarization direction of the reflective polarizer sheet 144 and reflect light polarized in a different direction than the predetermined polarization direction. Furthermore, the light reflected by the reflective polarizer film 144 may be recycled inside the light source device 100, and this recycling of light may improve brightness of the display apparatus 10.

The optical sheet 140 is not limited to the sheets or films as illustrated in FIG. 4, and may further include various other sheets or films such as protective sheets, quantum dot sheets, etc.

FIG. 5 is an enlarged perspective view of a portion of a light source device, according to an exemplary embodiment of the disclosure. FIG. 6 is a cross-sectional view along line A-A of FIG. 5. FIG. 7 is an enlarged view of a light emitting diode (LED) chip shown in FIG. 6.

The light source 111 of the light source device 100 will be described in connection with FIGS. 5 to 7.

As described above, the light source module 110 includes the plurality of light sources 111. The plurality of light sources 111 may protrude the through holes 120a from behind the reflecting sheet 120 and protrude forward from the reflecting sheet 120. Accordingly, as shown in FIGS. 5 and 6, portions of the light source 111 and the substrate 112 may be exposed through the through hole 120a.

The light source 111 may include an electrical/mechanical structure located in an area defined by the through hole 120a of the reflecting sheet 120.

According to an exemplary embodiment of the disclosure, each of the plurality of light sources 111 includes an LED chip 210, and an optical dome 220.

For an optical device including a lens, the number of light sources may be reduced by widening an optical diffusion area of light emitted by the light sources. However, due to the reduction of the number of light sources, the number of blocks for local dimming is reduced, which constrains improvement of the contrast ratio.

According to the disclosure, to improve uniformity of surface light emitted by the light source device 100 and improve the contrast ratio from the local dimming, the number of light sources 111 may increase in the light source device 100 without including lenses. Accordingly, an area occupied by each of the plurality of light sources 111 may become small. The optical dome 220 may cover each of the plurality of light sources 111 even with a smaller size than the lens.

The LED chip 210 may include a p-type semiconductor layer 213 and an n-type semiconductor layer 212 to emit light based on re-coupling between holes and electrons. Furthermore, the LED chip 210 is equipped with a pair of electrodes 211a and 211b to supply holes and electrons to the p-type semiconductor layer 213 and the n-type semiconductor layer 212, respectively.

According to the disclosure, the LED chip 210 may include a growth substrate 215, the p-type semiconductor layer 213, the n-type semiconductor layer 212, and a light-emitting layer 214. Furthermore, the LED chip 210 may further include a distributed Bragg reflector (DBR) layer 216, and a metal reflector layer 217. The metal reflector layer 217 may include aluminum (Al) or a DBR. The DBR included in the metal reflector 217 may include the same structure as that of the DBR layer 216.

Hereinafter, when the metal reflector 217 includes the DBR, the DBR layer 216 is referred to as a first DBR layer and the metal reflector layer 217 is referred to as a second DBR layer.

The growth substrate 215 may use a sapphire substrate that is useful for growth of a nitride semiconductor. It is not, however, limited thereto, but may be various substrates provided for single crystal semiconductor growth, such as a silicon substrate, a gallium nitride (GaN) substrate, etc. According to an exemplary embodiment of the disclosure, the growth substrate 215 may be a sapphire substrate.

The p-type semiconductor layer 213, the n-type semiconductor layer 212, and the light-emitting layer 214 may be formed of nitride semiconductors. The light emitting layer 214 may emit light as intense as band gap energy created by re-coupling between electrons and holes.

The pair of electrodes 211a and 211b may include an n-type element electrode 211a and a p-type element electrode 211b. The n-type element electrode 211a and the p-type element electrode 211b may be formed of materials that may make ohmic contact with a nitride semiconductor, and for example, may be formed of a metal such as silver (Ag), aluminum (Al), etc.

The DBR layer 216 may be provided by stacking up two materials having different refractive indexes. The DBR layer 216 and the metal reflector layer 217 may reflect light of a targeted wavelength.

The DBR layer 216 may be arranged on the top surface of the growth substrate 215. The DBR layer 216 may increase a light direction angle to the liquid crystal panel 20 by reflecting a portion of light emitted from the light-emitting layer 214.

The metal reflector layer 217 may be arranged on the bottom surface of the light-emitting layer 214. Like the DBR layer 216, the metal reflector layer 217 may increase a light direction angle to the liquid crystal panel 20 by reflecting a portion of light emitted from the light-emitting layer 214.

According to an exemplary embodiment of the disclosure, the DBR layer may be arranged on the top surface of the growth substrate 215, and the metal reflector layer may be arranged on the bottom surface of the light-emitting layer 214. Specifically, the first DBR layer 216 may be arranged on the top surface of the growth substrate 215, and the second DBR layer 217 may be arranged on the bottom surface of the light-emitting layer 214. Alternatively, the DBR layer 216 may be arranged on the top surface of the growth substrate 215, and the metal reflector layer 217 including a metal such as aluminum (Al) may be arranged on the bottom surface of the light-emitting layer 214.

The LED chip 210 may convert electric energy to optical energy. In other words, the LED chip 210 may emit light having the highest intensity at a predefined wavelength at which power is supplied. For example, the LED chip 210 may emit blue light having a peak value at a wavelength that represents blue color (e.g., a wavelength between 450 nm and 495 nm).

The LED chip 210 may be attached directly to the substrate 112 in a chip on board (COB) method. In other words, the light source 111 may include the LED chip 210 with the LED chip or an LED die attached directly to the substrate 112 without extra packaging.

The LED chip 210 may be provided such that the DBR layer 216 may have a horizontal side and a vertical side, which are hundreds of μm long. In other words, horizontal and vertical side lengths of the top surface of the growth substrate 215 may each be hundreds of μm. Preferably, horizontal and vertical side lengths of the top surface of the growth substrate 215 may each be 500 μm or less.

To reduce an area occupied by the LED chip 210, the LED chip 210 may be manufactured in a flip chip type that does not include a Zener diode. The LED chip 210 of the flip chip type may not use an intermediate medium such as a metal lead (wire) or a ball grid array (BGA) to attach the LED, which is a semiconductor device, to the substrate 112, but may fuse an electrode pattern of the semiconductor device onto the substrate 112 as it is.

This may make it possible for the light source 111 including the LED chip 210 of the flip chip type to become smaller by omitting the metal lead (wire) or the ball grid array.

To make the light source 111 compact, the light source module 110 with the LED chip 210 of the flip chip type attached to the substrate 112 in the COB method may be manufactured.

A power feed line 230 and a power feed pad 240 are arranged on the substrate 112 to supply power to the LED chip 210 of the flip chip type.

The power feed line 230 is arranged on the substrate 112 to supply an electrical signal and/or power from the control assembly 50 and/or the power assembly 60 to the LED chip 210.

As shown in FIG. 6, the substrate 112 may be formed by alternately stacking up non-conductive insulation layers 251 and conduction layers 252.

A line or pattern in which power and/or electrical signals pass is formed on the conduction layer 252. The conduction layer 252 may be formed of various electrically conductive materials. For example, the conduction layer 252 may be formed of various metal substances such as copper (Cu), tin (Sn), aluminum (Al) or an alloy thereof.

A dielectric of the insulation layer 251 may insulate gaps between lines or patterns of the conduction layer 252. The insulation layer 251 may be formed of a dielectric, e.g., FR-4, for electrical isolation.

The power feed line 230 may be implemented by a line or pattern formed on the conduction layer 252.

The power feed line 230 may be electrically connected to the LED chip 210 through the power feed pad 240.

The power feed pad 240 may be formed by exposing the power feed line 230 to the outside.

A protection layer 253 may be formed in an outermost portion of the substrate 112 to prevent or suppress damages to the substrate 112 due to external shocks and/or chemical actions (e.g., corruption) and/or optical actions. The protection layer 253 may include a photo solder resist (PSR).

As shown in FIG. 6 the protection layer 253 may cover the power feed line 230 to block the power feed line 230 from being exposed to the outside.

For electrical contact between the power feed line 230 and the LED chip 210, a window may be formed at the protection layer 253 to expose a portion of the power feed line 230 to the outside. A portion of the power feed line 230 exposed through the window of the protection layer 253 may form the power feed pad 240.

A conductive adhesive material 240a is applied onto the power feed pad 240 for electrical contact between the power feed line 230 exposed to the outside and the electrodes 211a and 211b of the LED chip 210. The conductive adhesive material 240a may be applied within the window of the protection layer 253.

The electrodes 211a and 211b of the LED chip 210 may contact the conductive adhesive material 240a, and the LED chip 210 may be electrically connected to the power feed line 230 through the conductive adhesive material 240a.

The conductive adhesive material 240a may include e.g., electrically conductive solder. It is not, however, limited thereto, and the conductive adhesive material 240a may include an electrically conductive epoxy adhesive.

Power may be supplied to the LED chip 210 through the power feed line 230 and the power feed pad 240, and the LED chip 210 may emit light when powered. A pair of power feed pads 240 may be provided to correspond to the pair of electrodes 211a and 211b, respectively, equipped in the LED chip 210 of the flip chip type.

The optical dome 220 may cover the LED chip 210. The optical dome 220 may refer to a light-transmitting resin layer. The optical dome 220 may prevent or suppress damage to the LED chip 210 due to an external mechanical action and/or chemical action. The optical dome 220 may prevent the LED chip 210 from being separated from the substrate 112 due to external shocks.

Furthermore, the optical dome 220 may increase light extraction efficiency of the LED chip 210 through index matching. Light emitted to the growth substrate 215 may not be output to the outside because of a difference in refraction index between the growth substrate 215 and air. The optical dome 220 reduces the difference in refraction index between the growth substrate 215 and air so that the light emitted from the LED chip 210 is output to the outside via the growth substrate 215 and the optical dome 220.

Furthermore, the optical dome 220 may protect the LED 111 from an external electrical action. Charges generated from electrostatic discharge may not pass through the optical dome 220 but flow across the outer surface of the optical dome 220.

The optical dome 220 may be shaped like, for example, a dome obtained by cutting a sphere without including the center or a semi-sphere obtained by cutting the sphere with the center included. A vertical cross-section of the optical dome 220 may have e.g., an arcuate form or a semi-circular form.

The optical dome 220 may be formed of silicon or epoxy resin. For example, melted silicon or epoxy resin is discharged onto the LED chip 210 through e.g., a nozzle, and then hardened to form the optical dome 220.

The optical dome 220 may be optically transparent or translucent. Light emitted from the LED chip 210 may pass through the optical dome 220 towards the outside.

In this case, the dome-shaped optical dome 220 may refract the light like a lens. For example, the light emitted from the LED chip 210 may be refracted and dispersed by the optical dome 220.

As such, the optical dome 220 may not only protect the LED chip 210 from an external mechanical action and/or chemical action or electrical action, but also diffuse the light emitted from the LED chip 210.

FIG. 8 illustrates an optical profile of an LED chip, according to an exemplary embodiment of the disclosure.

Referring to FIG. 8, according to an exemplary embodiment of the disclosure, the LED chip 210 has a bat-wing shaped optical profile. As described above, the LED chip 210 includes the first DBR layer 216 and the second DBR layer 217 on the upper and lower sides of the light-emitting layer 214, respectively. Alternatively the LED chip 210 may include the DBR layer 216 and the metal reflector layer 217 on the upper and lower sides of the light-emitting layer 214, respectively, with a bat-wing shaped optical profile.

The bat-wing shaped optical profile refers to an optical profile having a form that has a larger amount of light emitted from the LED chip 210 in a lateral direction than in the vertical direction. The amount of light emitted from the LED chip 210 to both sides are a bit different in FIG. 8. However, the amount of light emitted from the LED chip 210 to both sides is preferable to be the same.

When the LED chip 210 and the optical dome 220 covering the LED chip 210 have the bat-wing shaped optical profile, the number of LED chips 210 may be reduced while the optical distance remains the same. Furthermore, when the LED chip 210 and the optical dome 220 covering the LED chip 210 have the bat-wing shaped optical profile, the optical distance may be reduced while the number of LED chips 210 remains the same. That is, thickness or costs of the display apparatus 10 may be reduced.

The optical profile of the LED chip 210 is preferable to have the bat-wing shape as shown in FIG. 8. This is because having the bat-wing shaped optical profile makes it easy to convert light emitted from the LED chip 210, which corresponds to a point light source, to uniform surface light.

However, the optical profile of the LED chip 210 may be changed by the optical dome 220 provided on the LED chip 210. Specifically, because of the optical dome 220, the bat-wing shaped optical profile of the LED chip 210 may be changed to a Lambertian shape or other shapes than the bat-wing shape, which may not be intended by the designer.

FIG. 9 illustrates an optical profile in a case that an optical dome covers an LED chip, according to an exemplary embodiment of the disclosure.

According to the disclosure, the optical profile of the LED chip 210 having the bat-wing shaped optical profile may remain the same by defining a specific shape of the optical dome 220. In other words, even when the optical dome 220 is provided on the LED chip 210, the bat-wing shaped optical profile of the LED chip 210 may remain the same.

As described above, according to the disclosure, a ratio (h/d) of height (h) of the optical dome 220 to a diameter (d) of the bottom surface of the optical dome 220 may be defined to be 0.28±0.03. Alternatively, a ratio (h/d) of height (h) of the optical dome 220 to a diameter (d) of the bottom surface of the optical dome 220 may be 0.25 to 0.31. In this case, the ratio (h/d) of the height (h) of the optical dome to the diameter (d) of the bottom surface of the optical dome is preferable to be 0.28.

Referring to FIG. 9, when the optical dome 220 having the ratio (h/d) of the height (h) of the optical dome to the diameter (d) of the bottom surface of the optical dome described above covers the LED chip 210, the LED chip 210 may still have the bat-wing shaped optical profile. In comparison with FIG. 8, the optical dome 220 covers the LED chip 210 so that the LED chip 210 and the optical dome 220 may have an optical profile having uniformity in light emission to both sides. That is, the optical profile may be improved.

FIG. 10 illustrates an optical dome separated from the center of an LED chip, according to an exemplary embodiment of the disclosure. FIG. 11 is a cross-sectional view along line B-B of FIG. 10.

Referring to FIGS. 10 and 11, center c2 of the bottom surface of the optical dome 220 and center c1 of the top surface of the LED chip 210 may not match up. The top surface of the LED chip 210 may refer to the center of the DBR layer 216.

The center c2 of the bottom surface of the optical dome 220 and the center c1 of the top surface of the LED chip 210 may be separated from each other. In this case, a distance between the center c2 of the bottom surface of the optical dome 220 and the center c1 of the top surface of the LED chip 210 may be referred to as a separated distance s. That is, the center c2 of the bottom surface of the optical dome 220 and the center c1 of the top surface of the LED chip 210 may be separated sideways by the separated distance s.

According to the disclosure, the separated distance s and the diameter d of the bottom surface of the optical dome 220 may be defined as follows:

$$s/d \leq 0.2$$

That is, the separated distance s may be equal to or less than ⅕ of the diameter d of the bottom surface of the optical dome 220. When the separated distance s is within the above range, the LED chip 210 and the optical dome 220 may maintain the bat-wing shaped optical profile.

While the disclosure has been shown and described with reference to certain exemplary embodiments thereof, it will be understood by those skilled in the art that various changes in form and details may be made therein without departing from the spirit and scope of the disclosure as defined by the appended claims and their equivalents.

What is claimed:

1. A display apparatus comprising:
   a printed circuit board (PCB);
   a light emitting diode (LED) chip mounted on the PCB and configured to emit light;
   an optical dome disposed over and enclosing the LED chip;
   a liquid crystal panel configured to block or pass light output from the LED chip; and
   an optical film arranged between the LED chip and the liquid crystal panel,
   wherein a ratio of a height of the optical dome to a diameter of a bottom surface of the optical dome is 0.25 to 0.31,
   wherein the LED chip comprises a horizontal side and a vertical side, and
   wherein the vertical side is 500 μm or less in length and the horizontal side is 500 μm or less in length.

2. The display apparatus of claim 1, wherein the LED chip is provided to emit blue light.

3. The display apparatus of claim 2, wherein the optical film comprises a quantum dot sheet formed to enhance color reproducibility by making a change in wavelength of light.

4. The display apparatus of claim 1, wherein the LED chip is mounted on a mounting surface of the PCB in a chip on board (COB) method.

5. The display apparatus of claim 1, wherein a ratio of a distance between a center of the bottom surface of the optical dome and a center of the LED chip to the diameter of the bottom surface of the optical dome is greater than 0 but less than or equal to 0.2.

6. A display apparatus comprising:
   a printed circuit board (PCB);
   a light emitting diode (LED) chip mounted on the PCB and configured to emit light;
   an optical dome disposed over and enclosing the LED chip;
   a liquid crystal panel configured to block or pass light output from the LED chip; and
   an optical film arranged between the LED chip and the liquid crystal panel,
   wherein a ratio of a height of the optical dome to a diameter of a bottom surface of the optical dome is 0.25 to 0.31, and
   wherein the LED chip comprises an n-type semiconductor layer, a p-type semiconductor layer, and a light-emitting layer arranged between the n-type semiconductor layer and the p-type semiconductor layer configured to emit light.

7. The display apparatus of claim 6, wherein the LED chip further comprises:
   a growth substrate arranged to cover an upper surface of the n-type semiconductor layer or the p-type semiconductor layer,
   a distributed Bragg reflector (DBR) layer arranged on an upper surface of the growth substrate, and
   a metal reflector layer arranged on a lower surface of the light-emitting layer.

8. The display apparatus of claim 7, wherein the metal reflector layer comprises aluminum (Al) or a DBR.

9. The display apparatus of claim 7, wherein the growth substrate comprises a sapphire substrate.

10. A display apparatus comprising:
    a printed circuit board (PCB);
    a light emitting diode (LED) chip mounted on the PCB and configured to emit light;
    an optical dome disposed over and enclosing the LED chip;
    a liquid crystal panel configured to block or pass light output from the LED chip;
    an optical film arranged between the LED chip and the liquid crystal panel; and
    a reflecting sheet attached to the PCB, the reflecting sheet comprising a through hole provided for the optical dome to protrude through,
    wherein a ratio of a height of the optical dome to a diameter of a bottom surface of the optical dome is 0.25 to 0.31.

11. The display apparatus of claim 1, wherein the optical dome comprises silicon or epoxy resin.

12. A display apparatus comprising:
- a printed circuit board (PCB);
- a light emitting diode (LED) chip mounted on the PCB and configured to emit light;
- an optical dome disposed over and enclosing the LED chip;
- a liquid crystal panel configured to block or pass light output from the LED chip; and
- an optical film arranged between the LED chip and the liquid crystal panel,
- wherein a ratio of a height of the optical dome to a diameter of a bottom surface of the optical dome is 0.25 to 0.31, and
- wherein the ratio of the height of the optical dome to the diameter of the bottom surface of the optical dome is 0.28.

13. The display apparatus of claim 1, wherein the optical film comprises a diffuser plate configured to diffuse light emitted from the LED chip.

* * * * *